(12) United States Patent
Loucks, Jr. et al.

(10) Patent No.: US 8,481,963 B2
(45) Date of Patent: Jul. 9, 2013

(54) ION SLICER WITH ACCELLERATION AND DECELLERATION OPTICS

(75) Inventors: Harvey D. Loucks, Jr., La Honda, CA (US); James L. Bertsch, Palo Alto, CA (US); Michael Ugarov, San Jose, CA (US); William E. Barry, Sunnyvale, CA (US); Yevgeny Kaplun, Mountain View, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/406,157

(22) Filed: Feb. 27, 2012

(65) Prior Publication Data

US 2012/0217387 A1 Aug. 30, 2012

Related U.S. Application Data

(60) Provisional application No. 61/447,621, filed on Feb. 28, 2011.

(51) Int. Cl.
*H01J 37/147* (2006.01)
*H01J 37/04* (2006.01)
*G21K 1/04* (2006.01)
*H01J 49/06* (2006.01)

(52) U.S. Cl.
CPC .......... *H01J 37/045* (2013.01); *H01J 37/147* (2013.01); *G21K 1/04* (2013.01); *H01J 49/067* (2013.01)
USPC ........... 250/397; 250/305; 250/287; 250/398; 250/492.21

(58) Field of Classification Search
CPC .. H01J 37/28; H01J 49/06; H01J 27/022; H01J 37/147; H01J 49/40; H01J 49/067; G01N 23/225; G01N 23/2251
USPC ................. 250/305, 307, 397, 398, 492.21
See application file for complete search history.

(56) References Cited

U.S. PATENT DOCUMENTS

| | | | | |
|---|---|---|---|---|
| 3,937,958 | A * | 2/1976 | Rusch et al. | 250/307 |
| 4,139,773 | A * | 2/1979 | Swanson | 250/423 R |
| 5,065,034 | A * | 11/1991 | Kawanami et al. | 250/505.1 |
| 5,196,706 | A * | 3/1993 | Keller et al. | 250/396 R |
| 5,300,775 | A * | 4/1994 | Van der Mast | 250/305 |
| 5,945,677 | A * | 8/1999 | Leung et al. | 250/396 R |
| 6,797,947 | B2 * | 9/2004 | Russ et al. | 250/288 |
| 7,087,898 | B2 * | 8/2006 | Willoughby et al. | 250/288 |
| 7,176,455 | B1 * | 2/2007 | Whitehouse et al. | 250/288 |
| 7,244,952 | B2 * | 7/2007 | Mous | 250/492.21 |
| 7,427,752 | B2 * | 9/2008 | Jones et al. | 250/299 |

(Continued)

FOREIGN PATENT DOCUMENTS

| | | |
|---|---|---|
| GB | 2369721 A | 6/2002 |
| GB | 2388704 A | 11/2003 |
| JP | 2000294188 A | 10/2000 |

OTHER PUBLICATIONS

GB 1203146.4, Search Report dated Jun. 22, 2012, 1pg.

*Primary Examiner* — David A Vanore (57) ABSTRACT

Described herein is an ion slicer that: a) accelerates an ion beam towards a first electrode comprising an ion entrance slit, where the first electrode blocks a portion of ions with high displacement from the axis of the ion beam, thereby slicing the ion beam; and then b) decelerates the ion beam after it is sliced.

20 Claims, 5 Drawing Sheets

U.S. PATENT DOCUMENTS

| | | | | |
|---|---|---|---|---|
| 7,462,828 B2 * | 12/2008 | Fukada et al. | ................ | 250/310 |
| 7,633,064 B2 * | 12/2009 | Tsuneta et al. | ................ | 250/310 |
| 7,763,866 B2 * | 7/2010 | Frosien et al. | ............ | 250/492.23 |
| 7,928,406 B2 * | 4/2011 | Horsky et al. | ............. | 250/423 R |
| 8,110,820 B2 * | 2/2012 | Glavish et al. | ........... | 250/492.21 |
| 8,207,498 B2 * | 6/2012 | Fukuda et al. | ............... | 250/306 |
| 2002/0033458 A1 * | 3/2002 | Nagano et al. | ............. | 250/492.1 |
| 2005/0017195 A1 * | 1/2005 | Mous | ....................... | 250/396 R |
| 2005/0199803 A1 * | 9/2005 | Ueno | ........................ | 250/290 |
| 2007/0164205 A1 | 7/2007 | Truche et al. | | |
| 2007/0257207 A1 * | 11/2007 | Frosien et al. | ............ | 250/492.3 |
| 2008/0290266 A1 * | 11/2008 | Horsky et al. | ................. | 250/281 |
| 2012/0217387 A1 * | 8/2012 | Loucks et al. | ............... | 250/282 |
| 2012/0217388 A1 * | 8/2012 | Loucks et al. | ................ | 250/287 |

* cited by examiner

ION SLICER WITH ACCELERATION AND DECELERATION OPTICS

CROSS-REFERENCING

This patent application claims the benefit of U.S. provisional application Ser. No. 61/447,621, filed on Feb. 28, 2011, which provisional application is incorporated by reference herein.

BACKGROUND

Mass spectrometers are used to determine the chemical composition of substances and structures of molecules. Mass spectrometers may comprise an ion source to produce ions (e.g., to produce ionized neutral molecules) as well as a mass analyzer and ion detector. The mass analyzer may be a time-of-flight (TOF) mass analyzer, for example. TOF mass analyzers may be used to record the mass spectra of compounds or mixtures of compounds by measuring the times for molecular and/or fragment ions of those compounds to travel certain distances.

In orthogonal time of flight mass spectrometry instruments, it is sometimes necessary to control the energy of the beam approaching the orthogonal acceleration region. In such cases, the axial energy of the beam may be controlled to ensure that the ions hit the detector after they travel through the free flight region, and to achieve a good resolution. While the vertical position of the ions in the pulser of a time of flight spectrometer can be compensated for using space focusing techniques, the vertical energy leads to turn-around-time issues which cause bad resolution. So typically, in order to achieve high resolution, the beam is "sliced" to eliminate ions with excessive vertical velocity, both up and down. This is done by passing an ion beam through a slit in a plate so that the ions hit the plate and lose their charge.

BRIEF DESCRIPTION OF THE FIGURES

The accompanying drawings, which are incorporated herein, form part of the specification. Together with this written description, the drawings further serve to explain the principles of, and to enable a person skilled in the relevant art(s), to make and use the claimed systems and methods.

DETAILED DESCRIPTION

Described herein is a "fast slit" ion slicer. In general terms this device, comprises: a) a first electrode comprising an ion entrance slit that is at a voltage that provides for acceleration of an initial beam of ions approaching the slit; wherein the width of the slit is selected to block a portion of ions with high displacement from the axis of the ion beam; and, b) one or more lenses downstream from the first electrode, at a voltage or voltage(s) that provides for deceleration of the ions when they exit the one or more lenses. The geometry and potential distribution of the one or more lenses provides an ion beam that has low divergence in the axis.

A mass spectrometer system is also provided. In certain embodiments, the mass spectrometer system comprises: an ion source for producing ions; an ion guide for guiding a beam of the ions; a fast slit ion slicer; and an orthogonal time of flight (TOF) mass analyzer for analyzing the ions.

Finally, a method for slicing a low energy ion beam is provided. In general terms, this method comprises: accelerating the low energy ion beam towards a first electrode comprising an ion entrance slit, wherein the first electrode block a portion of ions with high displacement from the axis of the ion beam, thereby slicing the ion beam; and, decelerating the ion beam after it is sliced.

With reference to the description presented herein, the terms "vertical" and "transverse" are used interchangeably to refer to the direction in which ions travel in a downstream orthogonal time of flight mass analyzer. The term "horizontal" is perpendicular to both the vertical and longitudinal axes of an ion beam.

Time-of-flight measurements are particularly sensitive to the phase space of the ion beam, which includes both the beam size and divergence. In order to improve the quality of an ion beam it is common to use an ion slicer that blocks ions with particularly high divergence and/or high distance from the beam axis. Such ion slicers thus define the phase space of the beam entering the mass spectrometer. After slicing, the sliced ion beam (which in certain instances may conceptually resemble a "ribbon" of ions because the top and bottom of the beam have been removed), enters the time of flight spectrometer, and ions are pulsed into the flight tube of the TOF spectrometer. In some embodiments, the ions are pulsed in an orthogonal direction (e.g., upwards relative to the plane of the ribbon) down the flight tube. Slicing removes ions from the ion beam that have significant energy in the direction of the pulsing, and also allows a greater proportion of ions to be pulsed from the same starting point in the flight tube. Both of these features result in an increase in the resolution of the mass spectrometer.

Another characteristic of the performance of a mass spectrometer is the stability of operation, which can be potentially compromised by the accumulation of analyte molecules on the working surfaces of the slicer. This subsequently leads to charging of these surfaces which causes deflection of the ion beam. For example, if the working surfaces of the slicer get dirty and accumulate charge, the beam can be deflected or defocused. The low speed of ions amplifies this effect.

The electrical potential of a conventional slicer is typically in the range of 0 to 10V with respect to voltage used in the pulser region in a downstream time of flight mass spectrometer, whereas the axial kinetic energy of ions inside the pulser region is typically below 40 eV. As a result, the speed of ions is relatively low, which can lead to some of the problems described above.

Described herein is a "fast slit" ion slicer, i.e., an ion slicer that contains a slit through which ions travel at high velocity. Ions move through the slit of a fast slit ion slicer with an energy as much as 10× or more higher compared to ions passing through a conventional ion slicer. As a result, ion slicer longevity may be increase up to 10× because the effect of charging is roughly inversely proportional to the kinetic energy of the ions.

Ions can be accelerated towards a slit by applying a high potential to an electrode containing the slit. The potential can be as high as 500V, but is typically in the range of 100V to 300V. The fast slit can be located at a selected distance from the pulser area of the TOF mass spectrometer. The distance between the fast slit and the pulser should be sufficient to accommodate optics that are used to decelerate ions to a lower energy that is suitable for analysis in a time of flight analyzer. The axial kinetic energy of ions in the pulser of a time of flight mass spectrometer is typically in the range of 10 eV to 50 eV. In one specific implementation, the distance is on the order of 30-60 mm, although a distance outside this range may be employed under many circumstances. The decelerating optics not only provides a slower ion beam to the time of flight analyzer, but also restores the appropriate phase space of the beam with low cross-section and angular divergence in the "vertical" axis, i.e., in the same direction as the pulsing in a downstream orthogonal time of flight mass analyzer.

In certain embodiments, a fast slit ions slicer comprises: a) a first electrode comprising an ion entrance slit that is at a voltage that provides for acceleration of an initial beam of ions of relatively low energy that is approaching the slit. As noted above, the width of the slit is selected to block a portion of ions with high vertical displacement from the axis of the ion beam. A fast slit ion slicer also comprises: b) one or more lenses downstream from the first electrode, that provide an electric field that decelerate the ions. The geometry and potential distribution of the one or more lenses provides an ion beam that has low divergence in the vertical axis, thereby providing a sliced ion beam. The sliced beam that can be in the shape of a ribbon. In particular embodiments, the first electrode (i.e., the one that contains the fast slit) may have a voltage that increases the energy of the ions in the initial beam by 2-fold to 50-fold, and the one or more lenses may be at a voltage(s) that decrease the energy of the accelerated ions by 2-fold to 50-fold, thereby producing a beam that has low energy and a geometry that is suitable for time of flight analysis. The initial ion beam may have an energy in the range of 10 eV to 50 eV.

In one embodiment, anion beam is allowed to expand while accelerating towards the first electrode, and only the part of the beam containing ions with the smaller distance form the axis passes through the fast slit. In this configuration, a fast slit may be wider then typically used in convention slicers (i.e., it may have a width in the range of, e.g., 0.6 mm to 1.2 mm), which further improves the slicer longevity by spreading the contamination over the larger area and reducing the charge-induced field in the vicinity of the ion beam. In some embodiments, the width of the ion entrance slit in the first electrode may be in the range of 0.1 mm to 10 mm, e.g., in the range of 0.5 mm to 2 mm. After the passing through the fast slit, the low energy and parallelism can be restored using a variety of lens configurations. In particular embodiments, the one or more lenses downstream from the fast slit may comprise a pair of opposed plate electrodes (where the surface of the plate electrodes are in the x-y plane relative to the direction of the time of flight tube). The distance between the opposed plate electrodes may in certain cases be in the range of 0.2 mm to 2 cm, although this distance may vary greatly. Also, the number of such lenses may also vary.

Figure 1:
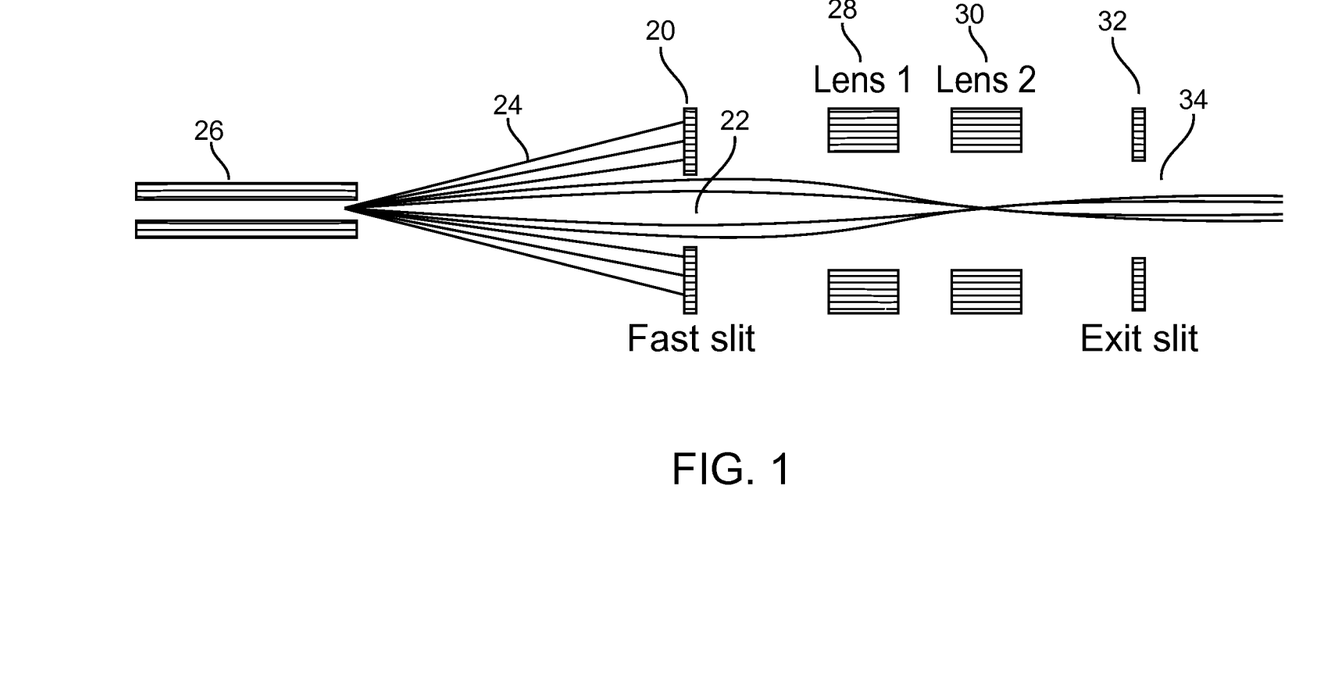
FIG. 1 schematically illustrates one exemplary configuration of optical components for a fast slit ion slicer.

One example of a fast slit ion slicer is illustrated in FIG. 1. As illustrated in FIG. 1, one embodiment of the device may comprise, a) first electrode 20, comprising an ion entrance slit 22 that is at a voltage that provides for acceleration of an initial, low energy, beam of ions 24 (e.g., a beam that has exited ion guide 26), where the width of the slit is selected to block a portion of ions with high displacement from the axis of the ion beam, as described above. This implementation of the subject device also contains i. a first lens 28, e.g., comprising a first pair of opposed plate electrodes, at a voltage that provides for deceleration of the ions that enter the first lens; ii. a second lens 30, e.g., comprising a second pair of opposed plate electrodes, at a voltage that provides for acceleration of the ions that enter the second lens. The device may contain a second electrode 32 comprising an ion exit slit 34 that is at a voltage that provides for ion deceleration. The device is configured so an ion beam is sliced by the first electrode to produce a sliced ion beam, and the sliced ion beam passes through the first and second lenses prior to exiting the device through the ion exit slit at relatively low energy. In one embodiment, the entrance slit 22 is maintained at high potential (for example, in the range of 100 V to 500 V, e.g., 200V) to provide for high ion velocity, first lens 28 is at lower voltage (e.g., in the range of 0V to 200V, e.g., 70V), which decelerates the ions. Second lens 30 is maintained at high voltage (in the range of 100 V to 500 V, e.g., 200V), and, finally, the slicer exit lens 32 is at low potential similar to the one of the downstream ion pulser plates in an orthogonal time of flight mass spectrometer (which may be in the range of 0V to 15V). All voltages have sign which is opposite to the sign of the analyzed ions.

The width of exit slit 34 may in certain cases be larger than the width of a slit in a conventional ion slicer in order to prevent any significant portion of ions from colliding with the lens. In this configuration, little or no contamination and charging of the exit slit may occur. As an option, the exit slit may eliminated as long as the gas conductance of the slicer is sufficiently low to prevent high pressure in the TOF MS analyzer.

A SIMION simulation (not shown) demonstrates that the required low cross section and divergence of the beam can be restored by the selection of suitable voltages on the lens elements. Simulation shows that the phase space of the beam is as good as that in convention slicer designs which comprise two slits of similar dimensions. In addition, the first slit design offers improvement in overall transmission without compromising the resolution of TOF MS analysis.

In certain cases and as shown in FIG. 1, the ion trajectories may in certain cases cross-over in the horizontal dimension of the beam during their passage through the subject device. Specifically, if the direction in which the ion beam is travelling is the x dimension and the width of the beam is y direction, then the ions may travel in the z or vertical direction (both up and down) to cross over the horizontal plane that contains the longitudinal axis of the ion beam, without crossing-over the vertical plane that contains the longitudinal axis of the ion beam. In other words, the ions may move from a position in the top half of the sliced beam to an equivalent position in the bottom part of the sliced beam, without significant lateral movement (e.g., without moving from one side of the beam to the other). There is a potential for space charge induced problems if a beam has a narrow cross-over. However, under typical operating conditions this is not likely. Further, any crossover would occur a region of high ion velocity and low ion density, which also reduces the probability of space charge effects.

In order to address this potential crossover issue if it becomes a problem, as well as to provide the desired beam geometry, the shapes of one or more of the downbeam lenses can be designed so that there is no cross-over in the horizontal direction. For example, simulation shows that the use of lenses with opposing parallel electrodes provides a beam-crossover only in one dimension, which considerably reduces the chances of space charge issues. At the same time, the resulting divergence of the beam in the horizontal direction is still sufficient to maintain sensitivity.

Figure 2:
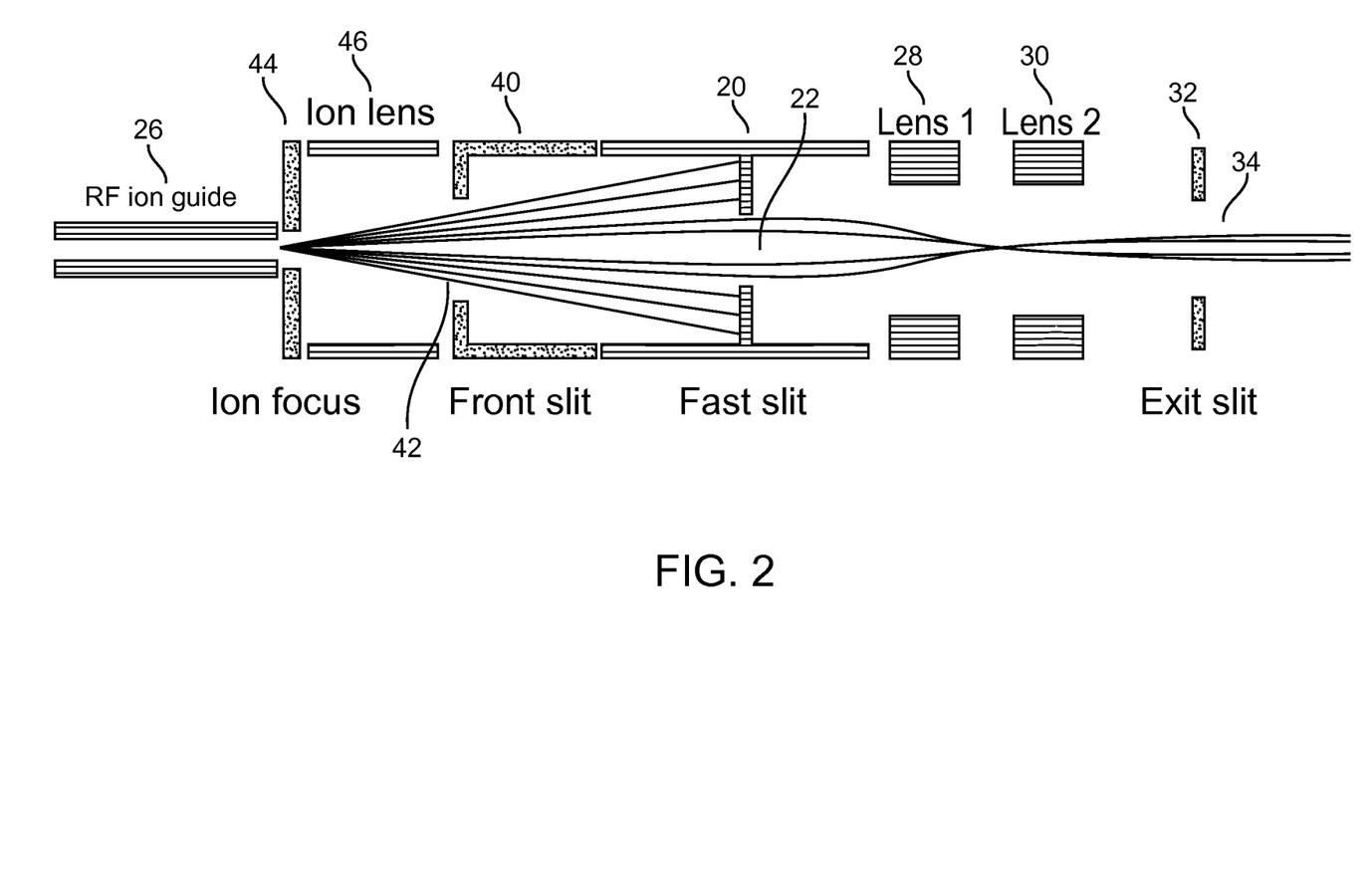
FIG. 2 schematically illustrates another exemplary configuration of optical components for a fast slit ion slicer.

FIG. 2 shows a more specific configuration of optics elements that not only provides the features described above (i.e., ion guide 26, first electrode 20, comprising an ion entrance slit 22 that is at a voltage that provides for ion acceleration, first lens 28 comprising at a voltage that provides for deceleration of the ions that enter the first lens; second lens 30 at a voltage that provides for acceleration of the ions that enter the second lens; and third lens 32 comprising an ion exit slit 34) but also incorporate a "front" electrode 40 containing front slit 42. In one embodiment, the two sides of the front slit can be set at slightly different voltages which provide a possibility of steering the ion beam in the vertical direction. This provides a way for compensating for any potential mechanical misalignment of the optics and achieves an optimum beam direction before it enters the TOF extraction area. The dimensions of the front slit may be large enough so that few or no ions trajectories collide with the front electrode.

Additionally, two more DC voltage elements may be located immediately after the ion guide and before the front slit, e.g., a circular lens electrode of a small diameter 44 and a larger cylindrical element 46. Their role may be to provide shielding from the RF fields, as well as to shape of the initial beam.

The shape of the front slit may be used to control the geometry of the beam. Simulations have shown that a slit with an about 2:1 ratio between horizontal and vertical dimensions (where the "horizontal" dimension of the aperture is in the same orientation as the slit in the first electrode) offers improved beam geometry and results in the satisfactory transmission. This configuration was also found to be less sensitive to the horizontal misalignment of the elements if the slicer as opposed to more square openings (such as, e.g., those with a 5:4 or 4:4 ratio).

Table 1 summarizes a set of some of the possible voltage settings for various optical elements that may provide adequate performance in one configuration. These voltages illustrate a possible set of voltages only. The actual voltages that one may use may vary greatly depending upon the intended use and the particular geometry of the optical system. As an example, the fast slit used can have a width of 0.6 mm to 1.2 mm, and the front slit dimensions can be optimized in a wide range of values (including, for example 8 mm×4 mm, although larger or smaller dimensions may be used). The velocity of the ions in this system may be defined by the voltage on the ion guide, because this is the last element where they experience multiple collisions with gas. All voltages are relative to the reference plate in the ion pulser. As would be readily apparent, the polarities of the voltages described herein (i.e., whether a voltage is positive or negative) may be changed depending on the charge of the ions that are being analyzed.

As a result, high resolution can be achieved, albeit at a cost of some sensitivity loss. Conversely, higher collimation before the slit will provide high sensitivity at reduced resolution. As an example, smaller divergence of the ion beam can be achieved by setting the front slit to lower absolute values (30-40V).

In another embodiment, tuning of the slicer for the specific performance can be achieved by varying the size of the fast slit. If the width of the slit can be changed (e.g., mechanically), the compromise between resolution and sensitivity can be adjusted. In a specific embodiment, the instrument can have two or more "operating modes" that are selected depending on the goal of a particular application.

Figure 4:
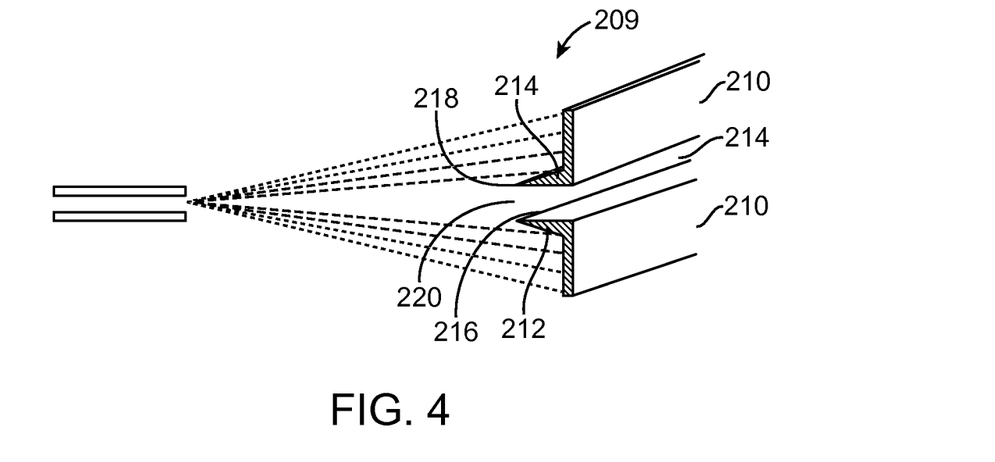
FIG. 4 schematically illustrates one example of a bladed slicer.

In one embodiment, the fast slit, i.e., the first electrode, may be bladed and may comprise a body; a first elongated blade; and a second elongated blade; wherein the bladed ion slicer comprises a slit that extends through the body through which ions pass and wherein the edges of the first and second elongated blades define the entrance of the slit and are pointing towards the ion beam, as exemplified in FIG. 4.

A cross-section of one example of a bladed first electrode is schematically illustrated in FIG. 4. In general terms, bladed first electrode 209 comprises: a) a body 210; b) a first elongated blade 212; and c) a second elongated blade 214; wherein the bladed ion slicer comprises a slit 214 that extends through the body 210 and through which ions pass. As illustrated, the edges (i.e., the sharp, cutting edge) of the first and second elongated blades 216 and 218, respectively define the entrance 220 of the slit and are pointing towards the ion beam (i.e., the edges points in a direction that is counterflow to the ion beam). In particular embodiments and as illustrated in FIG. 4, the edges of the first and second elongated blades may be parallel to each another. In other embodiments, the spacing between the edges of the first and second elongated blades may vary and in certain cases may increase or decrease, gradually or in a step-wise manner, from one end of the slit to the other. By shifting the blades from side to side, different slit sizes can be presented to the ion beam to facilitate trading sensitivity for resolution. Similarly, shifting the blades sideways could be used to present a fresh surface to the ion beam to decrease charging. In some cases, as illustrated in FIG. 4, the slit has an ion entrance end and an ion exit end, and the ion exit end is wider than the ion entrance end. In particular cases, walls of the slit may be at angle of e.g., 1° to 15° to one another such that the ion exit end is wider than the ion entrance end, which prevents ions from colliding with the wall of the slit. The slit may a width in the range of 0.1 mm to 10 mm, although a width in the range of 0.5 mm to 2 mm may be used for many purposes. A bladed ion slicer may be made from a conductive material, e.g., stainless steel or an electri-

| | Element | | | | | | | | |
|---|---|---|---|---|---|---|---|---|---|
| | Ion guide | Ion Focus | Ion lens | Front slit | Fast slit | Lens 1 | Lens 2 | Exit slit | TOF pulser |
| Voltage | 12 V | −20 V | −10 V | −50 V | −200 V | −50 V | −200 V | 0 V | 0 V |

In one embodiment, it is possible to tune the voltage settings on the slicer optics so that the divergence of the beam before the slit is modified and the amount of the beam that is blocked may change. This provides a way to alter the resolution and sensitivity of the downstream mass spectrometer. Specifically, if the beam is left to diverge more in front of the slit, the smaller portion of the space phase will be transmitted.

cally conductive creamic. The bladed slicer may be electrically connected to provide a voltage potential that accelerates ions entering the slicer, as described above. In certain embodiments, at least the blades of the slicer may have a thin coating of a material that improves the surface properties of the slicer, e.g., for edge retention and/or corrosion resistance, hardness or stability. Titanium nitride is an example of such a coating, although other coatings can be used. In certain cases such a device may be a monolithic structure that is made using wire electrical discharge machining. The edge of the blade may in certain cases have a radius or chamfer of between 0 mm and 0.1 mm.

Figure 5:
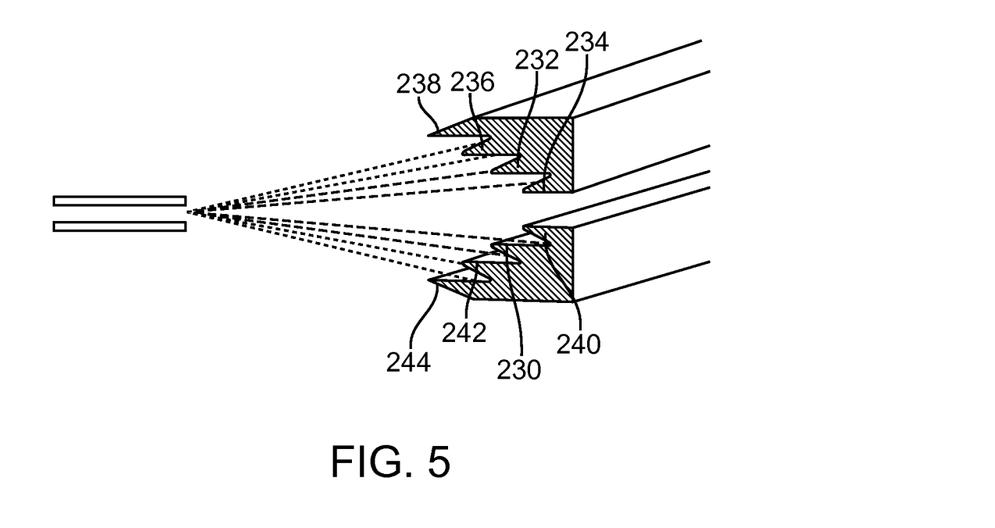
FIG. 5 schematically illustrates another example of a bladed slicer.

In certain embodiments and as illustrated in FIG. 5, a bladed first electrode may comprise a third elongated blade 230 and a fourth elongated blade 232, where, as illustrated, the edges of the third and fourth elongated blades are directed towards the ion beam and are parallel to and proximal to the first and second elongated blades, respectively. In certain cases, the edges of the third and fourth blades may be distanced from edges of the first and second blades by a distance in the range of, e.g., 0.05 mm to 1 mm, respectively, although this distance can vary greatly depending on the desired application. In particular embodiments and as illustrated in FIG. 5, the edges of the first and second elongated blades may recessed relative to the third and fourth elongated blades.

Figure 3:
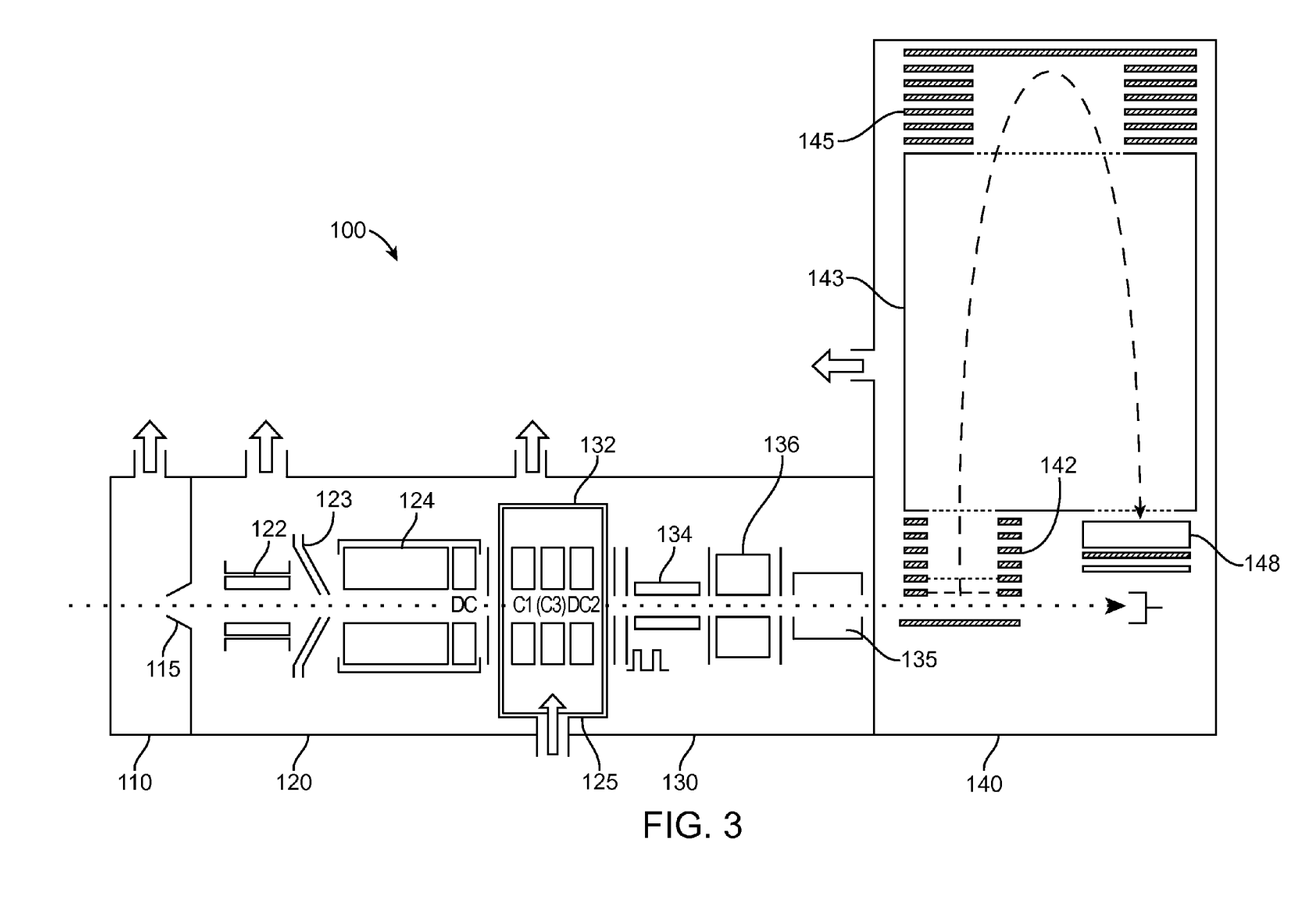
FIG. 3 schematically illustrates a mass spectrometer system in which a subject fast slit slicer is employed.

In some embodiments, a bladed first electrode may comprises at least three blades extending along both sides of the elongated slit, wherein the edges of the blades are pointed towards the ion beam the blades are increasingly recessed towards the elongated slit. FIG. 3 illustrates a blading slicer containing four blades on either side of the slit (blades 232, 234, 236 and 238 being above the slit, and blades 230, 240, 242 and 244 being below the slit), wherein the blades are increasingly recessed towards the slit.

The angle of the blade(s) relative to the axis of the ion beam may vary greatly depending on the desired application, as can the relative angle of the sides of each of the individual blades. In a particular embodiment, the side of the blades that is closer to the longitudinal axis of the ion beam (i.e., the side of the blades that is closer to the slit) is angled in the range of 10 to 30 degrees relative to the longitudinal axis of the ion beam. In certain cases the side of the blades that is further from the longitudinal axis of the ion beam (i.e., the side of the blades that is further from the slit) may in certain cases be is angled in the range of 1 to 60 degrees relative to the longitudinal axis.

Figure 6:
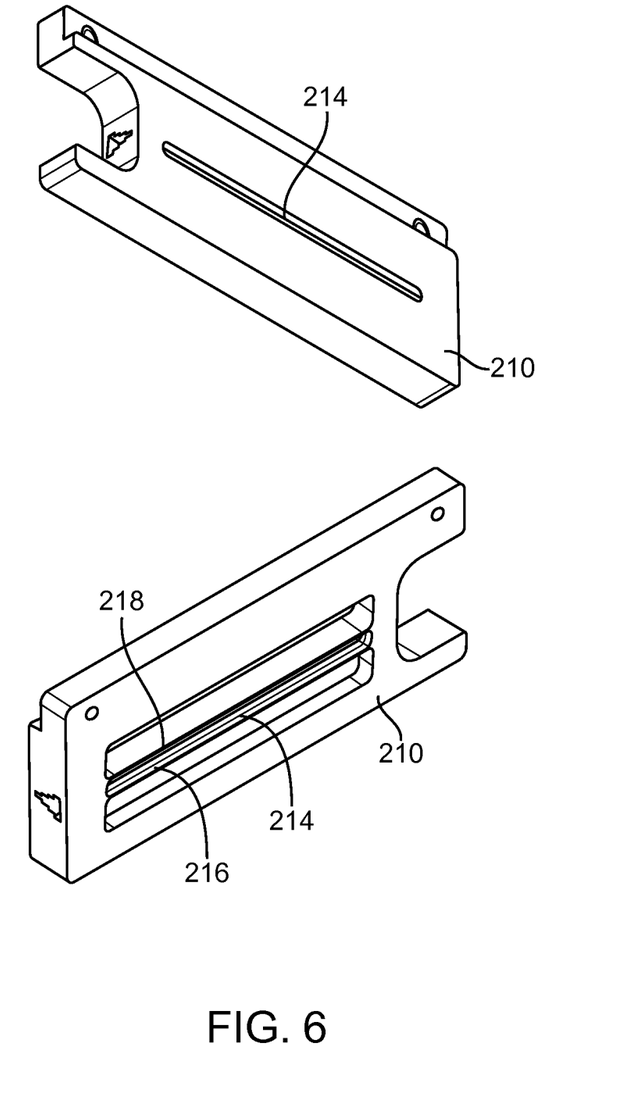
FIG. 6 shows perspective views of an exemplary bladed slicer.

FIG. 6 is a diagram illustrating an example of a bladed first electrode that contains multiple blades, shown from the ion exit side (top) and ion entrance side (bottom). As shown in FIG. 6, slit 214 extends through body 210, and the entrance of the slit on the ion entrance side of the slicer is defined by elongated blades 216 and 218. As can be seen in FIG. 6, the bladed slit, the length of the knife edges, is much wider than the width of the beam, thus allowing for the slit to be moved periodically sidewise to expose fresh blade surfaces to the ion beam.

A mass spectrometer system is provided. In certain embodiments, the system comprises: an ion source for producing ions; an ion guide for guiding a beam of the ions; a slicer containing a fast slit, as described above, for slicing the beam. As noted above, the slicer may comprise: a) a first electrode comprising an ion entrance slit that is at a voltage that provides for acceleration of an initial beam of ions approaching the slit; wherein the width of the slit is selected to block a portion of ions with high displacement from the axis of the ion beam; and, b) one or more lenses downstream from the first electrode, at a voltage or voltages that provides for deceleration of the ions when they exit the one or more lenses; wherein the geometry and potential distribution of the one or more lenses provides a low divergence ion beam in the vertical axis, thereby maintaining the ribbon shape of the sliced ion beam. The mass spectrometer system also contains an orthogonal time of flight (TOF) mass analyzer for analyzing the ions. In certain cases, at least one of the voltages of the slicer may be tunable to provide for higher sensitivity and lower resolution, or lower sensitivity and higher resolution, of the TOF mass analyzer. In particular cases, the ion exit end of the ion guide is spaced from the ion entrance slit of the device at a distance that provides blocking of ions that have a defined divergence from the beam axis. While a variety of voltages may be used, in certain embodiments, the ion guide may be at voltage in the range of 5 V to 50 V; the first electrode may be at voltage in the range of 100 V to 500 V; and the one or more lenses may be at a voltage in the range of 0 to 200 V. The system may in certain embodiments also have a second electrode comprising an aperture, between the ion guide and the first electrode, for shaping and/or steering the ion beam. This aperture may in certain cases be wider in the horizontal axis than in the vertical axis. The mass spectrometer system may further comprise a ring electrode and a cylindrical electrode between the ion guide and the second electrode, to provide an RF shield and/or to shape initial beam divergence.

The above-described fast slit ion slicer can be used in any mass spectrometry system, particularly one in which has an orthogonal time of flight mass spectrometer. Many examples of such systems are known. FIG. 3 illustrates an example of a tandem mass spectrometer 100 (a quadrupole/time-of-flight or 'q-TOF') that includes a time-of-flight (TOF) mass analyzer and also incorporates the fast slit slicer described above. FIG. 3 shows the positioning of the subject fast slit slicer relative to other components in a single exemplary machine. Other configurations of the elements shown in FIG. 3 would be apparent to one of skill in the art.

As shown in FIG. 3, the tandem mass spectrometer 100 includes an ion source 110 having a skimmer 115 at the downstream end for filtering the introduction of ions into the vacuum stages of the mass spectrometer. In a first vacuum stage 120, analyte ions are guided through an octopole 122, ion lenses 123 and a first mass analyzer 124. Ions that are not eliminated in the first mass analyzer 124 pass into a second vacuum stage 130 via an aperture. The second vacuum stage 130 includes, in sequence, a collision cell 132, in which analyte ions may be fragmented into smaller ions and neutral particles, an octopole ion guide 134 and a further quadrupole ion guide 136 maintained at a dc voltage.

The product ions output from the collision cell are guided through the octopole 134 and quadrupole ion guide 136 into a subject fast slit slicer 135 that is used to block some of the ions having a high degree of transverse displacement (displacement in the direction of the flight tube, as discussed above), before the entrance to the to an orthogonal acceleration chamber of the TOF mass analyzer 140. The ions blocked by the fast slit slicer 135 accumulate on its surface.

Ions that pass through fast slit slicer 135 enter an ion pulser 142 having a back plate and an acceleration column. To start the ion's flight through the flight tube 143, a high voltage pulse is applied to the back plate that accelerates ions through a stack of plate in the acceleration column. The ions then travel through the flight tube in a 'downstream' direction toward an electrostatic ion minor 145. The ion minor 145 reverses the flow of ions back in the 'upstream' direction of the flight tube. The ions reversed by the ion minor flow toward a detector 148, which registers the impact of ions and their flight times through the flight tube 143.

A method for slicing a low energy ion beam, such that a beam that has exited an ion guide, is also provided. In certain embodiments this method may comprises accelerating the low energy ion beam towards a first electrode comprising an ion entrance slit, wherein the first electrode block a portion of ions with high displacement from the axis of the ion beam, thereby slicing the ion beam; and decelerating the ion beam after it is sliced. The ion beam may be pulsed into an orthogonal time of flight mass spectrometer after it is sliced. In one embodiment, the method comprises directing a beam of ions at a device comprising: a) a first electrode comprising an ion entrance slit; b) a first lens comprising a first pair of opposed plate electrodes; c) a second lens comprising a second pair of opposed plate electrodes; d) a second electrode comprising an ion exit slit; wherein the ion beam is sliced by the first electrode to produce a ribbon of ions that passes through the first and second lenses prior to exiting the device through the ion exit slit, and wherein first electrode accelerates the ions, the first lens decelerates the ions, the second lens accelerates the ions and the second electrode decelerates the ions.

EMBODIMENTS

Embodiment 1

A device for slicing a beam of ions, comprising: a) a first electrode comprising an ion entrance slit configured to operate at a voltage that provides for acceleration of an initial beam of ions approaching said slit; wherein the width of said slit is selected to block a portion of ions with high displacement from the axis of the ion beam; and, b) one or more lenses downstream from said first electrode, configured to operate at a voltage or voltages that provide(s) for deceleration of the ions, wherein the geometry and potential distribution of said one or more lenses provides a ion beam with low divergence from the axis.

Embodiment 2

The device of embodiment 1, wherein first electrode has a voltage that increases the energy of the ions in said initial beam by 2-fold to 50-fold, and said one or more lenses decreases the energy of the accelerated ions by 2-fold to 50-fold.

Embodiment 3

The device of any prior embodiment, wherein said initial beam of ions has energy in the range of 1 eV to 50 eV.

Embodiment 4

The device of any prior embodiment, wherein the ions cross-over in a plane of the beam that contains the longitudinal axis as they travel through said one or more lenses.

Embodiment 5

The device of any prior embodiment, wherein the width of the ion entrance slit in said first electrode is in the range of 0.6 mm to 1.2 mm.

Embodiment 6

The device of any prior embodiment, wherein the width of the ion entrance slit in said first electrode is in the range of 0.1 mm to 10 mm.

Embodiment 7

The device of any prior embodiment, wherein said one or more lenses comprises a pair of opposed plate electrodes.

Embodiment 8

The device of embodiment 7, wherein the distance between said opposed plate electrodes is in the range of 0.2 mm to 2 cm.

Embodiment 9

The device of any prior embodiment, wherein said one or more lenses comprises: i a first lens configured to operate at a voltage that provides for deceleration of the ions that enter said first lens; ii. a second lens configured to operate at a voltage that provides for acceleration of the ions that enter said second lens; and wherein the device further comprises a second electrode comprising an ion exit slit configured to operate at a voltage that provides for ion deceleration; wherein said device is configured so the initial ion beam is sliced by said first electrode to produce a sliced ion beam, and said sliced ion beam passes through said first and second lenses prior to exiting said device through said ion exit slit.

Embodiment 10

The device of any prior embodiment, wherein said first electrode is bladed and comprises: a) a body; b) a first elongated blade connected to the body; and c) a second elongated blade connected to the body; wherein the ion slicer comprises a slit that extends through said body through which ions pass and wherein the edges of said first and second elongated blades define the entrance of said slit and are pointing towards said ion beam.

Embodiment 11

The device of embodiment 10, wherein the edges of said first and second elongated blades are parallel to each another.

Embodiment 12

The device of embodiments 10 or 11, further comprising a third elongated blade and a fourth elongated blade, wherein the edges of said third and fourth elongated blades are directed towards said ion beam and are parallel to and proximal to said first and second elongated blades, respectively.

Embodiment 13

The device of embodiment 12, wherein the edges of said first and second elongated blades are recessed relative to said third and fourth elongated blades.

Embodiment 14

The device of embodiment 12, wherein said ion slicer comprises at least three blades extending along either side of said elongated slit, wherein the edges of said blades are pointed towards said ion beam and said blades are increasingly recessed towards said elongated slit.

Embodiment 15

The device of any of embodiments 10-14, wherein the side of said blades that is further from the longitudinal axis of the ion beam is angled in the range of 10 to 60 degrees relative to the longitudinal axis of the ion beam.

Embodiment 16

The device of embodiment 15, wherein the side of said blades that is closer to the longitudinal axis of the ion beam is angled in the range of 1 to 30 degrees relative to said longitudinal axis.

Embodiment 17

The device of any of embodiments 10-16, wherein the slit has an ion entrance end and an ion exit end, and the walls that extend from said ion entrance end and sais ion exit end are at an angle in the range of 1° to 15° relative to one another such that said ion exit end of said slit is larger than the ion entrance end of said slit.

Embodiment 18

The device of any of embodiments 10-17, wherein said slit has a width in the range of 0.1 mm to 10 mm.

Embodiment 19

The device of any of embodiments 10-18, wherein said ion slicer is a monolithic structure made using wire EDM.

Embodiment 20

The device of device of any of embodiments 10-19, wherein said ion slicer is made from a conductive ceramic.

Embodiment 21

The device of device of any of embodiments 10-21, where the edge of the blade has a radius or chamfer of between 0 mm and 0.1 mm.

Embodiment 22

A mass spectrometer system comprising: a) an ion source for producing ions; b) ion guide for guiding a beam of said ions; c) a time of flight (TOF) mass analyzer for analyzing the ions, wherein said TOF comprises a pulser that pulses ions in a direction that is orthogonal to the longitudinal axis of said beam; and d) a device of claim 1 between said ion guide and said TOF mass analyzer, wherein said device blocking a portion of ions with high displacement from the axis of the ion beam in the direction of said pulsing.

Embodiment 23

The mass spectrometer system of embodiment 22, wherein at least one of said voltages is tunable to provide for higher sensitivity and lower resolution, or lower sensitivity and higher resolution, of said TOF mass analyzer.

Embodiment 24

The mass spectrometer system of embodiment 22 or 23, wherein the ion exit end of said ion guide is spaced from said ion entrance slit at a distance that provides for blocking of ions that have a defined distance from the beam axis.

Embodiment 25

The mass spectrometer system of any of embodiments 22-24, wherein:

said ion guide is configured to operate at a voltage in the range of 5 V to 50 V;
said first electrode is configured to operate at a voltage in the range of 100 V to 500 V;
said one or more lenses comprises a decelerating lens configured to operate at a voltage in the range 0 to 200V.

Embodiment 26

The mass spectrometer system of any of embodiments 22-25, further comprising a second electrode comprising an aperture, between said ion guide and said first electrode, for shaping and/or steering the ion beam.

Embodiment 27

The mass spectrometer system of embodiment 26, wherein said aperture is wider in the horizontal axis than in the vertical axis.

Embodiment 28

The mass spectrometer system of embodiment 26, further comprising a ring electrode and a cylindrical electrode between said ion guide and said second electrode, to provide an RF shield and/or to the ion beam.

Embodiment 29

The mass spectrometer system of any of embodiments 22-28, wherein said first electrode is bladed and comprises: a) a body; b) a first elongated blade connected to the body; and c) a second elongated blade connected to the body; wherein the ion slicer comprises a slit that extends through said body through which ions pass and wherein the edges of said first and second elongated blades define the entrance of said slit and are pointing towards said ion beam.

Embodiment 30

A method for slicing an ion beam, comprising: accelerating an ion beam towards a first electrode comprising an ion entrance slit, wherein said first electrode blocks a portion of ions with high displacement from the axis of the ion beam, thereby slicing said ion beam; and, decelerating said ion beam after it is sliced.

Embodiment 31

The method of embodiment 30, wherein said accelerating increases the energy of the ions in the beam by 2-fold to 50-fold, and said decelerating decreases the energy of the accelerated ions by 2-fold to 50-fold.

Embodiment 32

The method of any of embodiments 30 or 31, wherein the ion beam is pulsed into an orthogonal time of flight mass spectrometer after it is sliced.

Embodiment 33

The method of any of embodiments 30-32, wherein said method accelerating and decelerating is done by a device comprising: a) a first electrode comprising an ion entrance slit; b) a first lens comprising a first pair of opposed plate electrodes; c) a second lens comprising a second pair of opposed plate electrodes; and d) a second electrode comprising an ion exit slit; wherein said ion beam is sliced by said first electrode to produce a ribbon of ions that passes through said first and second lenses prior to exiting said device through said ion exit slit, and wherein first electrode accelerates said ions, said first lens decelerates said ions, said second lens accelerates said ions and said second electrode decelerates said ions.

The foregoing description of the invention has been presented for purposes of illustration and description. It is not intended to be exhaustive or to limit the invention to the precise form disclosed. Other modifications and variations may be possible in light of the above teachings. The embodiments were chosen and described in order to best explain the principles of the invention and its practical application, and to thereby enable others skilled in the art to best utilize the invention in various embodiments and various modifications as are suited to the particular use contemplated. It is intended that the appended claims be construed to include other alternative embodiments of the invention; including equivalent structures, components, methods, and means.

Unless defined otherwise, all technical and scientific terms used herein have the same meaning as commonly understood by one of ordinary skill in the art to which this invention belongs.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination. All combinations of the embodiments are specifically embraced by the present invention and are disclosed herein just as if each and every combination was individually and explicitly disclosed, to the extent that such combinations embrace operable processes and/or devices/systems/kits.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

What is claimed is:

1. A device for slicing a beam of ions, comprising:
    a) a first electrode comprising an ion entrance slit configured to operate at a voltage that provides for acceleration of an initial beam of ions approaching said slit; wherein the width of said slit is selected to block a portion of ions with high displacement from the axis of the ion beam; and,
    b) one or more lenses downstream from said first electrode, configured to operate at a voltage or voltages that provide(s) for deceleration of the ions, wherein the geometry and potential distribution of said one or more lenses provides a ion beam with low divergence from the axis.

2. The device of claim 1, wherein first electrode has a voltage that increases the energy of the ions in said initial beam by 2-fold to 50-fold, and said one or more lenses decreases the energy of the accelerated ions by 2-fold to 50-fold.

3. The device of claim 1, wherein said initial beam of ions has energy in the range of 1 eV to 50 eV.

4. The device of claim 1, wherein the ions cross-over in a plane of the beam that contains the longitudinal axis as they travel through said one or more lenses.

5. The device of claim 1, wherein the width of the ion entrance slit in said first electrode is in the range of 0.6 mm to 1.2 mm.

6. The device of claim 1, wherein the width of the ion entrance slit in said first electrode is in the range of 0.1 mm to 10 mm.

7. The device of claim 1, wherein said one or more lenses comprises:
    i. a first lens configured to operate at a voltage that provides for deceleration of the ions that enter said first lens;
    ii. a second lens configured to operate at a voltage that provides for acceleration of the ions that enter said second lens; and
    wherein the device further comprises a second electrode comprising an ion exit slit configured to operate at a voltage that provides for ion deceleration;
    wherein said device is configured so the initial ion beam is sliced by said first electrode to produce a sliced ion beam, and said sliced ion beam passes through said first and second lenses prior to exiting said device through said ion exit slit.

8. The device of claim 1, wherein said first electrode is bladed and comprises:
    a) a body;
    b) a first elongated blade connected to the body; and
    c) a second elongated blade connected to the body;
    wherein the ion slicer comprises a slit that extends through said body through which ions pass and wherein the edges of said first and second elongated blades define the entrance of said slit and are pointing towards said ion beam.

9. The device of claim 1, further comprising a third elongated blade and a fourth elongated blade, wherein the edges of said third and fourth elongated blades are directed towards said ion beam and are parallel to and proximal to said first and second elongated blades, respectively.

10. A mass spectrometer system comprising:
    a) an ion source for producing ions;
    b) ion guide for guiding a beam of said ions;
    c) a time of flight (TOF) mass analyzer for analyzing the ions, wherein said TOF comprises a pulser that pulses ions in a direction that is orthogonal to the longitudinal axis of said beam; and
    d) a device of claim 1 between said ion guide and said TOF mass analyzer, wherein said device blocks a portion of ions with high displacement from the axis of the ion beam in the direction of said pulsing.

11. The mass spectrometer system of claim 10, wherein at least one of said voltages is tunable to provide for higher sensitivity and lower resolution, or lower sensitivity and higher resolution, of said TOF mass analyzer.

12. The mass spectrometer system of claim 10, wherein the ion exit end of said ion guide is spaced from said ion entrance slit at a distance that provides for blocking of ions that have a defined distance from the beam axis.

13. The mass spectrometer system of claim 10, wherein:
    said ion guide is configured to operate at a voltage in the range of 5 V to 50 V;
    said first electrode is configured to operate at a voltage in the range of 100 V to 500 V;
    said one or more lenses comprises a decelerating lens configured to operate at a voltage in the range 0 to 500V.

14. The mass spectrometer system of claim 10, further comprising a second electrode comprising an aperture, between said ion guide and said first electrode, for shaping and/or steering the ion beam.

15. The mass spectrometer system of claim 14, wherein said aperture is wider in the horizontal axis than in the vertical axis.

16. The mass spectrometer system of claim 14, further comprising a ring electrode and a cylindrical electrode between said ion guide and said second electrode, to provide an RF shield and/or to the ion beam.

17. The mass spectrometer system of claim 14, wherein said first electrode is bladed and comprises:
   a) a body;
   b) a first elongated blade connected to the body; and
   c) a second elongated blade connected to the body;
   wherein the ion slicer comprises a slit that extends through said body through which ions pass and wherein the edges of said first and second elongated blades define the entrance of said slit and are pointing towards said ion beam.

18. A method for slicing an ion beam, comprising:
   accelerating an ion beam towards a first electrode comprising an ion entrance slit, wherein said first electrode blocks a portion of ions with high displacement from the axis of the ion beam, thereby slicing said ion beam; and,
   decelerating said ion beam after it is sliced.

19. The method of claim 18, wherein said accelerating increases the energy of the ions in the beam by 2-fold to 50-fold, and said decelerating decreases the energy of the accelerated ions by 2-fold to 50-fold.

20. The method of claim 18, wherein the ion beam is pulsed into an orthogonal time of flight mass spectrometer after it is sliced.

* * * * *